(12) United States Patent
Li et al.

(10) Patent No.: US 11,672,083 B2
(45) Date of Patent: Jun. 6, 2023

(54) METHOD OF MANUFACTURING COMPOSITE CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Yang Li, Guangdong (CN); Yan-Lu Li, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

(*) Notice: Subject to any disclaimer, the term of this patent is extended or adjusted under 35 U.S.C. 154(b) by 69 days.

(21) Appl. No.: 17/497,815

(22) Filed: Oct. 8, 2021

(65) Prior Publication Data
US 2022/0030723 A1  Jan. 27, 2022

Related U.S. Application Data

(62) Division of application No. 17/030,521, filed on Sep. 24, 2020, now Pat. No. 11,191,168.

(30) Foreign Application Priority Data

Mar. 5, 2020  (CN) .......................... 202010146448.X

(51) Int. Cl.
*H05K 1/00* (2006.01)
*H05K 1/02* (2006.01)
(Continued)

(52) U.S. Cl.
CPC ........ *H05K 3/3452* (2013.01); *H05K 3/0029* (2013.01); *H05K 3/022* (2013.01); *H05K 3/321* (2013.01); *H05K 2203/0228* (2013.01)

(58) Field of Classification Search
CPC .. H05K 1/00; H05K 1/02; H05K 1/03; H05K 1/09; H05K 1/11; H05K 1/14; H05K 1/18; H05K 1/141; H05K 1/148; H05K 1/188; H05K 1/189; H05K 3/02; H05K 3/06; H05K 3/10; H05K 3/14; H05K 3/34; H05K 3/36; H05K 3/46; H05K 3/52; H05K 3/321; H05K 3/4691; H01L 21/02; H01L 21/44;
(Continued)

(56) References Cited

U.S. PATENT DOCUMENTS

2003/0067064 A1* 4/2003 Kim ...................... H01L 25/105
257/734
2004/0145054 A1* 7/2004 Bang ................. H01L 23/49816
257/737
(Continued)

*Primary Examiner* — Xiaoliang Chen
(74) *Attorney, Agent, or Firm* — ScienBiziP, P.C.

(57) ABSTRACT

A composite circuit board includes a composite circuit board unit, a first solder mask formed on a first metal protection layer of the composite circuit board unit, and a second solder mask formed on a second metal protection layer of the composite circuit board unit. Two ends of a first outer conductive circuit are bent back toward each other and spaced apart a predetermined distance to form a first window. Two ends of a second outer conductive circuit are bent back toward each other and spaced apart a predetermined distance to form a second window.

10 Claims, 15 Drawing Sheets

(51) Int. Cl.
| | |
|---|---|
| H05K 1/03 | (2006.01) |
| H05K 1/09 | (2006.01) |
| H05K 1/11 | (2006.01) |
| H05K 1/14 | (2006.01) |
| H05K 1/18 | (2006.01) |
| H05K 3/02 | (2006.01) |
| H05K 3/06 | (2006.01) |
| H05K 3/10 | (2006.01) |
| H05K 3/14 | (2006.01) |
| H05K 3/34 | (2006.01) |
| H05K 3/36 | (2006.01) |
| H05K 3/46 | (2006.01) |
| H01L 21/02 | (2006.01) |
| H01L 21/44 | (2006.01) |
| H01L 21/48 | (2006.01) |
| H01L 21/50 | (2006.01) |
| H01L 21/56 | (2006.01) |
| H01L 21/68 | (2006.01) |
| H01L 23/02 | (2006.01) |
| H01L 23/12 | (2006.01) |
| H01L 23/14 | (2006.01) |
| H01L 23/24 | (2006.01) |
| H01L 23/34 | (2006.01) |
| H01L 23/48 | (2006.01) |
| H01L 23/52 | (2006.01) |
| H01L 23/498 | (2006.01) |
| H01L 23/552 | (2006.01) |
| H05K 3/32 | (2006.01) |
| H05K 3/00 | (2006.01) |

(58) Field of Classification Search
CPC ......... H01L 21/48; H01L 21/50; H01L 21/56;
H01L 21/68; H01L 23/02; H01L 23/12;
H01L 23/14; H01L 23/24; H01L 23/34;
H01L 23/48; H01L 23/52; H01L 23/498;
H01L 23/552; H01L 25/105
USPC ................ 174/261, 250, 252, 254–258, 262;
257/666, 686, 734, 737, 758, 778;
438/106, 107, 613, 666; 29/830, 846
See application file for complete search history.

(56) References Cited

U.S. PATENT DOCUMENTS

2006/0043562 A1\* 3/2006 Watanabe ............ H05K 1/0233
438/455
2009/0038836 A1\* 2/2009 Takahashi ............ H05K 3/4691
29/830

\* cited by examiner

METHOD OF MANUFACTURING COMPOSITE CIRCUIT BOARD

CROSS-REFERENCE TO RELATED APPLICATIONS

This is a divisional application of patent application Ser. No. 17/030,521, filed on Sep. 24, 2020, assigned to the same assignee, which is based on and claims priority to China Patent Application No. 202010146448.X filed on Mar. 5, 2020, the contents of which are incorporated by reference herein.

FIELD

The subject matter herein generally relates to composite circuit boards, and more particularly to a composite circuit board and a method of manufacturing the composite circuit board.

BACKGROUND

A chip on flex (COF) circuit substrate has ultra-fine conductive circuits and good flexibility, and has been widely used in thin, narrow frame, and full-screen electronic products. Generally speaking, due to its own properties, COF does not meet the requirements of surface mount technology (SMT). Therefore, COF needs to be integrated with flexible circuit boards into composite circuit boards. However, the manufacturing method of the composite circuit board has a long process, and the dimensional stability of an inner COF of the finished product is not good.

BRIEF DESCRIPTION OF THE DRAWINGS

Implementations of the present disclosure will now be described, by way of embodiments, with reference to the attached figures.

DETAILED DESCRIPTION

Figure 1:
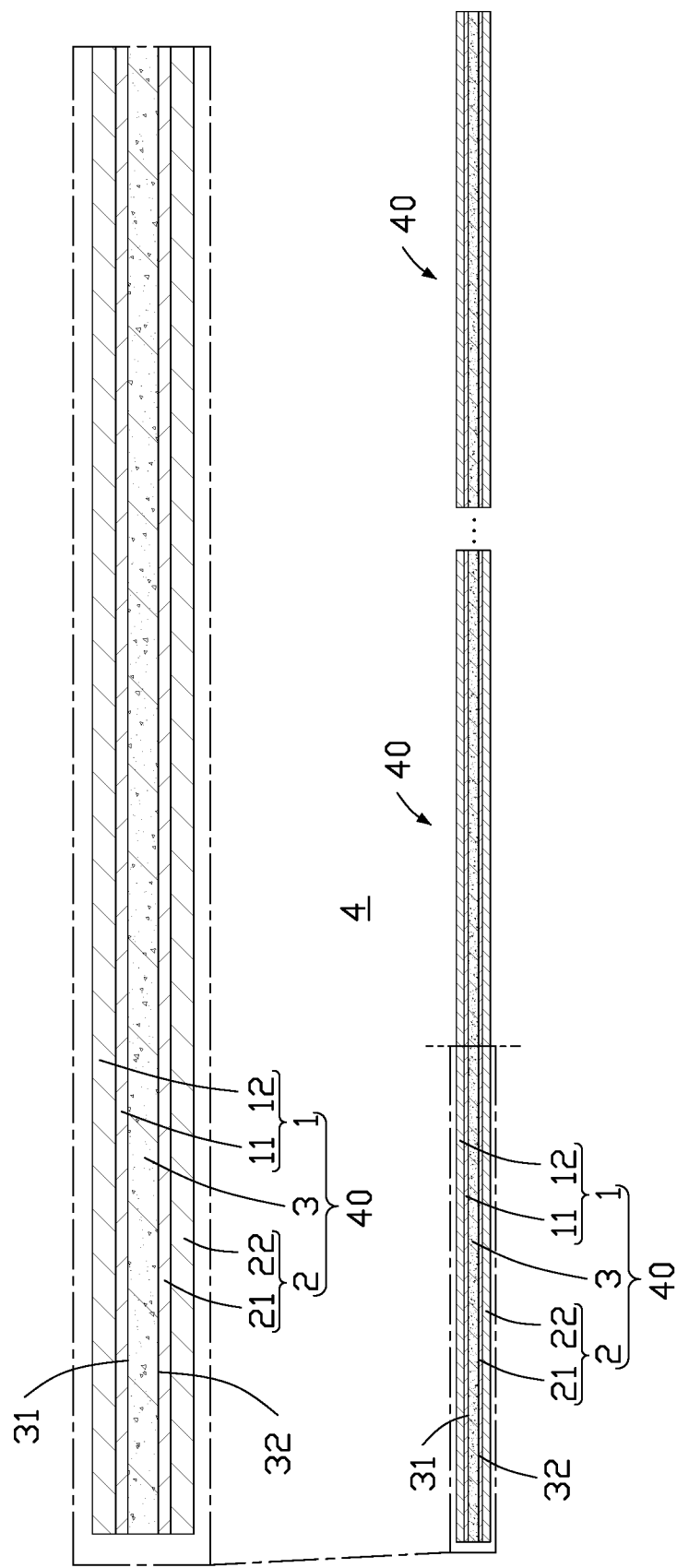
FIG. 1 is a cross-sectional view of a composite substrate provided by a first embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIGS. 1-8 show a first embodiment of a method of manufacturing a composite circuit board including the following steps.

Referring to FIG. 1, a coiled first copper-clad substrate 1, a coiled second copper-clad substrate 2, and a coiled first adhesive material layer 3 are provided. The coiled copper-clad substrate refers to a roll of a flexible copper-clad substrate. The copper-clad substrate in the form of a roll is suitable for processing and production by a roll-to-roll production process (RTR).

In one embodiment, the first copper-clad substrate 1 and the second copper-clad substrate 2 are both single-sided copper-clad substrates. The first copper-clad substrate 1 includes a first insulating layer 11 and a first copper-clad layer 12 formed on a surface of the first insulating layer 11. The second copper-clad substrate 2 includes a second insulating layer 21 and a second copper-clad layer 22 formed on a surface of the second insulating layer 21. The first insulating layer 11 and the second insulating layer 21 are made of flexible materials, such as polyimide (PI), polyethylene terephthalate (PET), and polyethylene naphthalate (PEN). In other embodiments, the copper-clad substrate may also be a double-sided copper-clad substrate.

The first adhesive material layer 3 includes a first surface 31 and an opposite second surface 32. The first adhesive material layer 3 is a two-sided adhesive, such that the first adhesive material layer 3 can be separated into a first adhesive layer 301 and a second adhesive layer 302. Thus, a thickness of the first adhesive material layer 3 is a sum of thicknesses of the first adhesive layer 301 and the second adhesive layer 302. The first insulating layer 11 of the first copper-clad substrate 1 is formed on the first surface 31 in the RTR process, and the second insulating layer 21 of the second copper-clad substrate is formed on the second surface 32 in the RTR process.

Referring to FIG. 1, the composite substrate 4 includes a plurality of composite substrate units 40 coupled in sequence. Each composite substrate unit 40 includes the first adhesive material layer 3 as a middle layer, the first insulating layer 11 and the second insulating layer 21 respectively located on the first surface 31 and the second surface 32 of the first adhesive material layer 3, and the first copper-clad layer 12 and the second copper-clad layer 22 respectively located on the surface of the first insulating layer 11 facing away from the first adhesive material layer 3 and the surface of the second insulating layer 21 facing away from the first adhesive material layer 3.

Figure 2:
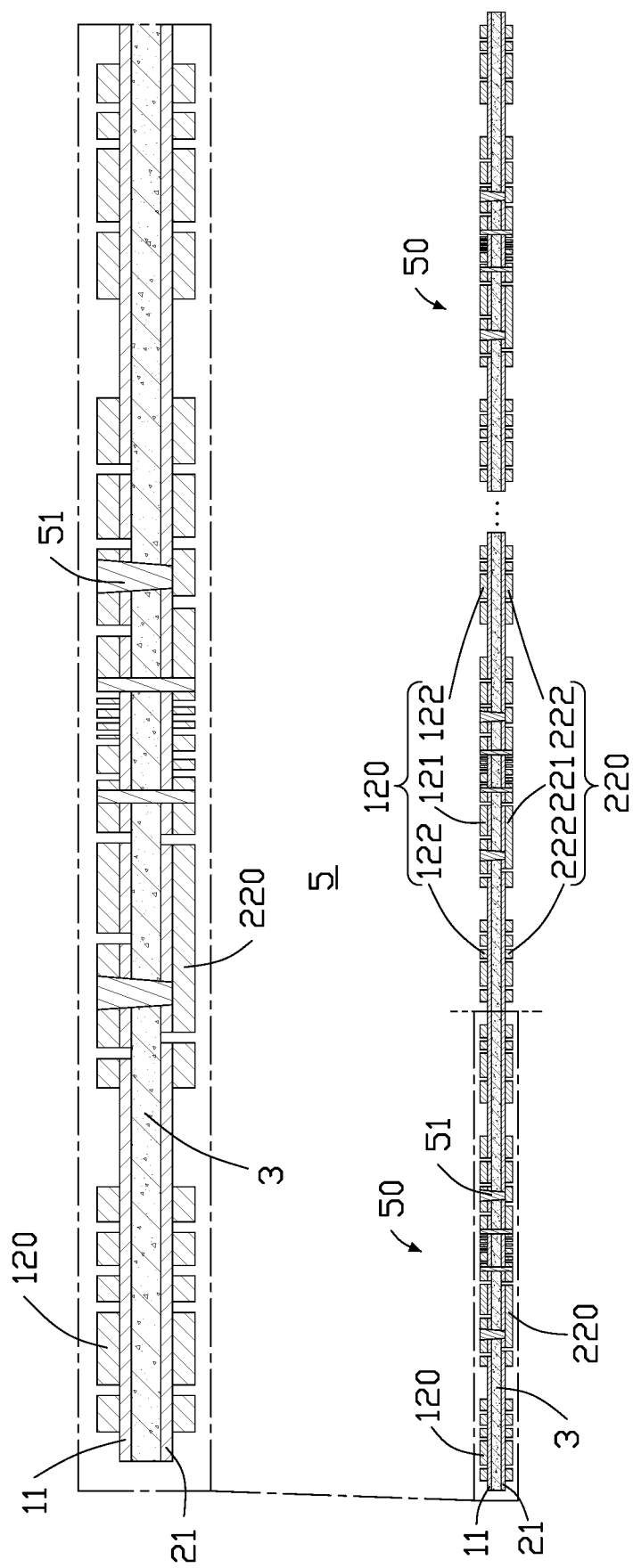
FIG. 2 is a cross-sectional view of forming the composite substrate shown in FIG. 1 into a composite circuit board intermediate structure.

Referring to FIG. 2, the composite substrate 4 is etched in the RTR process to form a first circuit layer 120 from the first copper-clad layer 12 and a second circuit layer 220 from the second copper-clad layer 22 in each composite substrate unit 40 to obtain a composite circuit board intermediate structure 5. The composite circuit board intermediate structure 5 includes a plurality of coupled composite circuit board units 50. The first circuit layer 120 includes a first inner conductive circuit 121 and a first outer conductive circuit 122 located at two ends of the first inner conductive circuit 121. The second circuit layer 220 includes a second inner conductive circuit 221 and a second outer conductive circuit 222 located at two ends of the second inner conductive circuit 221.

A method for etching the composite substrate 4 may be chemical etching or laser ablation. After etching, at least one first conductive hole 51 is defined in each composite circuit board unit 50. The first conductive hole 51 is used for electrically coupling the first inner conductive circuit 121 and the second inner conductive circuit 221. The first conductive hole 51 may be a conductive blind hole or a conductive through hole.

Figure 3:
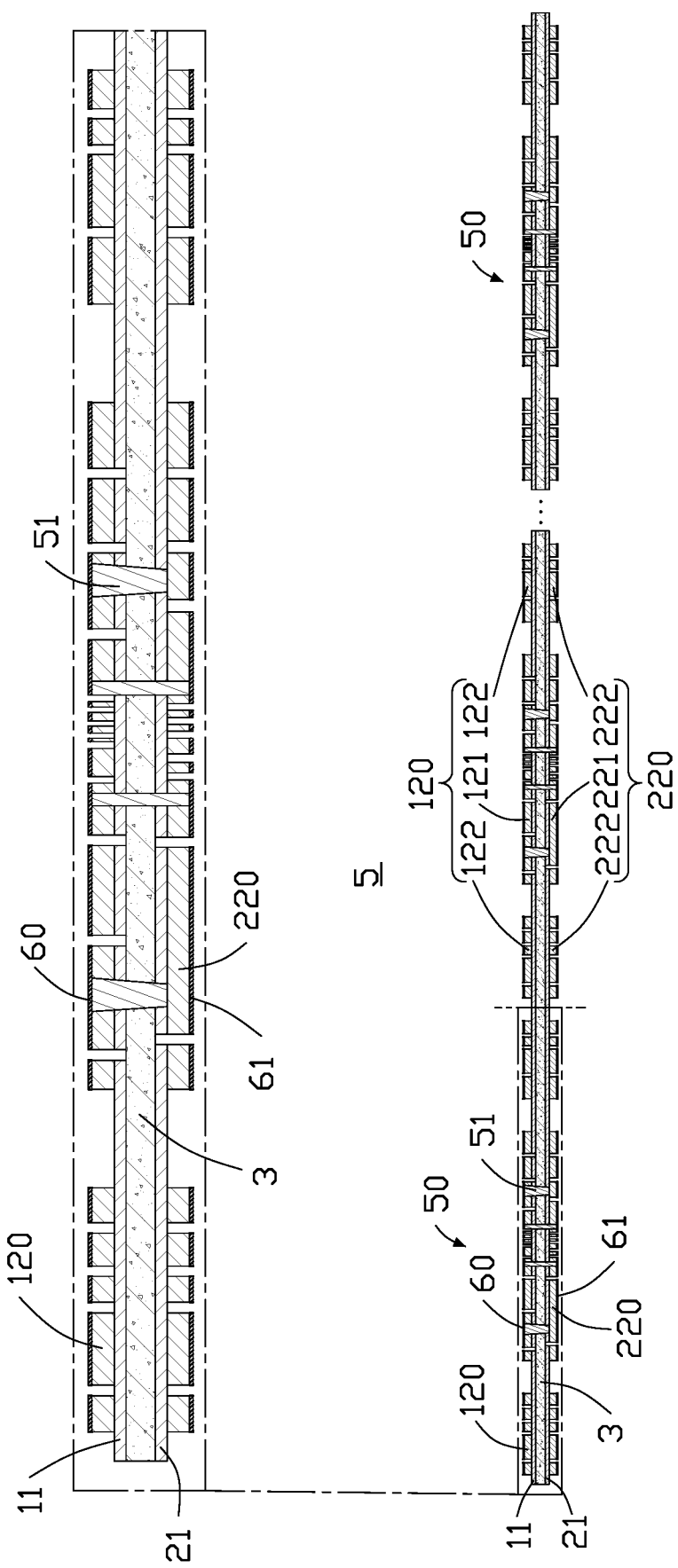
FIG. 3 is a cross-sectional view of forming a first metal protection layer and a second metal protection layer.

Referring to FIG. 3, surface treatment is performed on thin circuits of the entire composite circuit board intermediate structure 5. In one embodiment, the first inner conductive circuit 121 and the second inner conductive circuit 221 are thin circuits. A first metal protection layer 60 is formed on a surface of the first inner conductive circuit 121, and a second metal protection layer 61 is formed on a surface of the second inner conductive circuit 221 of each composite circuit board unit 50. A method for surface treatment includes electroless plating or electroplating. In one embodiment, the first metal protection layer 60 and the second metal protection layer 61 are made of tin.

Figure 4:
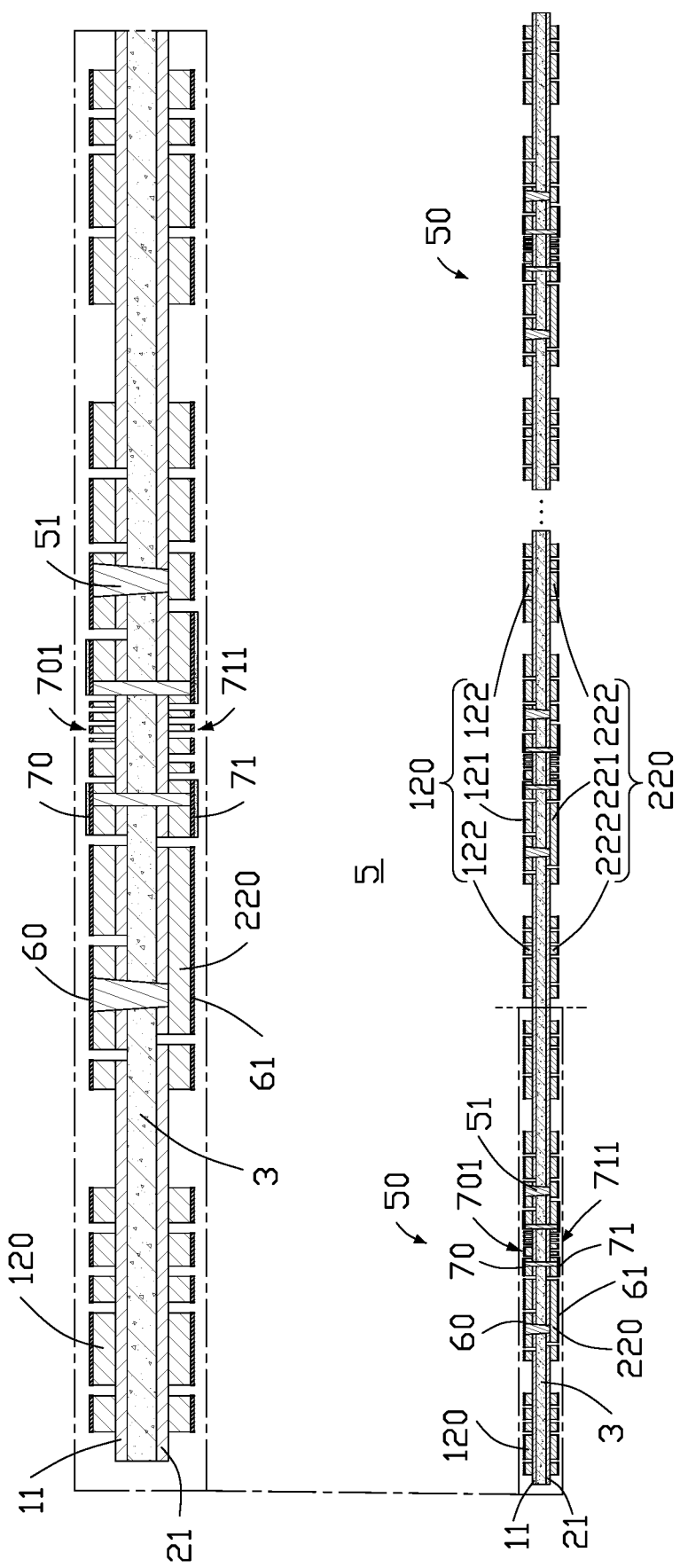
FIG. 4 shows a first solder mask and a second solder mask formed on a surface of the first metal protection layer and the second metal protection layer.

Referring to FIG. 4, the first predetermined positions on a surface of the first metal protection layer 60 and the second metal protection layer 61 are subjected to a solder mask treatment, and a portion of the first metal protection layer 60 forms a first solder mask 70, and a portion of the second metal protection layer 61 forms a second solder mask 71. The first solder mask 70 defines a first opening 701, and the first opening 701 reveals a portion of the first metal protection layer 60. The second solder mask 71 defines a second opening 711, and the second opening 711 reveals a portion of the second metal protection layer 61. The first predetermined position refers to a position where a subsequent composite circuit board 100 forms a window, or a position subsequently defined as a COF region. That is, the portion of the first metal protection layer 60 revealed by the first opening 701 can be used as a COF area for setting a driver IC, and the portion of the second metal protection layer 61 revealed by the second opening 711 can be used as a COF area for setting a driver IC.

Figure 5:
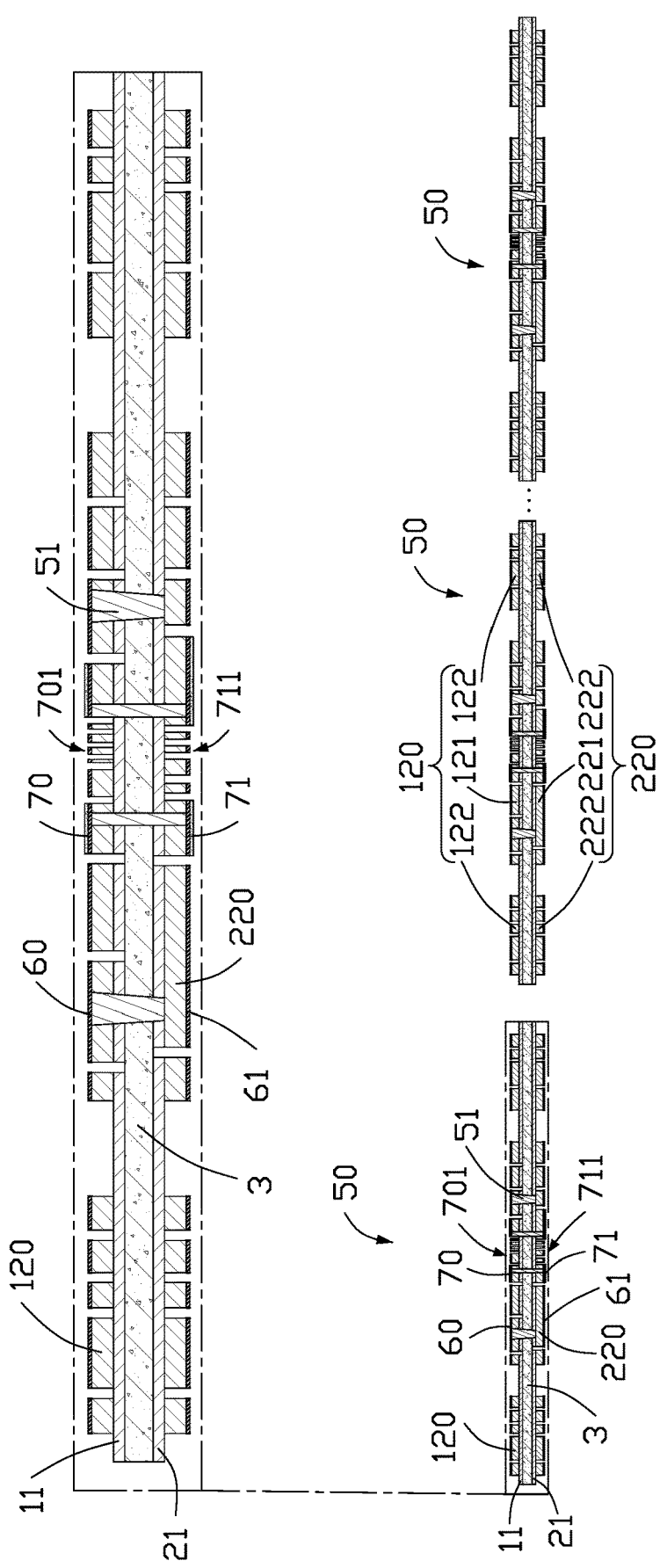
FIG. 5 is a cross-sectional view of a plurality of separated composite circuit board units obtained from FIG. 4.

Referring to FIG. 5, a boundary of each composite circuit board unit 50 in the composite circuit board intermediate structure 5 is cut by a die, a milling cutter, or another tool to obtain a plurality of separated composite circuit board units 50. Each composite circuit board unit 50 includes the first adhesive material layer 3 as the middle layer, the first insulating layer 11 located on the first surface 31 of the first adhesive material layer 3, and the second insulating layer 21 located on the second surface 32 of the first adhesive material layer 3, the first circuit layer 120 located on the surface of the first insulating layer 11 facing away from the first adhesive material layer 3, and the second circuit layer 220 located on the surface of the second insulating layer 21 facing away from the first adhesive material layer 3.

Figure 6:
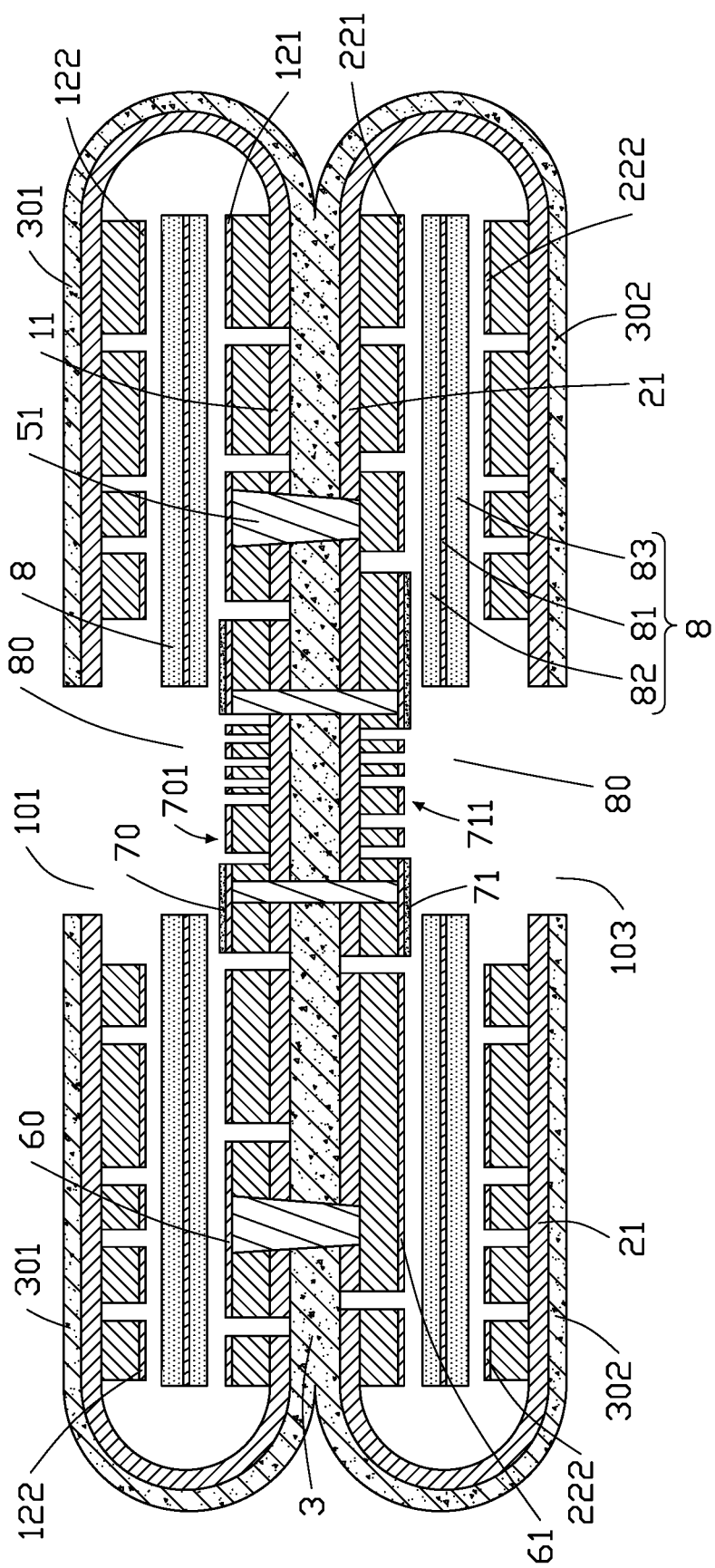
FIG. 6 is a diagram of separating a first adhesive material into a first adhesive layer and the second adhesive layer.

Referring to FIG. 6, the first adhesive material layer 3 of each composite circuit board unit 50 is split from opposite ends of the first adhesive material layer 3 to a second predetermined position of the first adhesive material layer 3, thereby separating the first adhesive material layer 3 into the first adhesive layer 301 and the second adhesive layer 302. The second predetermined position refers to a position where a first window 101 of a predetermined size can be formed by bending back the separated first adhesive layers 301 and the separated second adhesive layers 302 toward each other. In one embodiment, a thickness of the separated first adhesive layer 301 is equal to a thickness of the separated second adhesive layer 302.

Further referring to FIG. 6, two second adhesive material layers 8 are respectively provided on surfaces of the first inner conductive circuit 121 and the second inner conductive circuit 221. In one embodiment, each second adhesive material layer 8 includes a third insulating layer 81 and a third adhesive layer 82 and a fourth adhesive layer 83 respectively formed on opposite surfaces of the third insulating layer 81. A thickness of the third insulating layer 81 can be reduced to 4 microns, and the third insulating layer 81 can subsequently have a better insulating effect on the first inner conductive circuit 121 and the first outer conductive circuit 122. Each second adhesive material layer 8 defines a third opening 80, and a size of the third opening 80 is smaller than a size of the first solder mask 70 or the second solder mask 71. The second adhesive material layer 8 is also flexible material.

One of the third adhesive layers 82 of the second adhesive material layer 8 covers a portion of the first solder mask 70 and the first metal protection layer 60 revealed by the first solder mask 70. The other one of the third adhesive layers 82 covers a portion of the second solder mask 71 and the second metal protection layer 61 revealed by the second solder mask 71.

Figure 7:
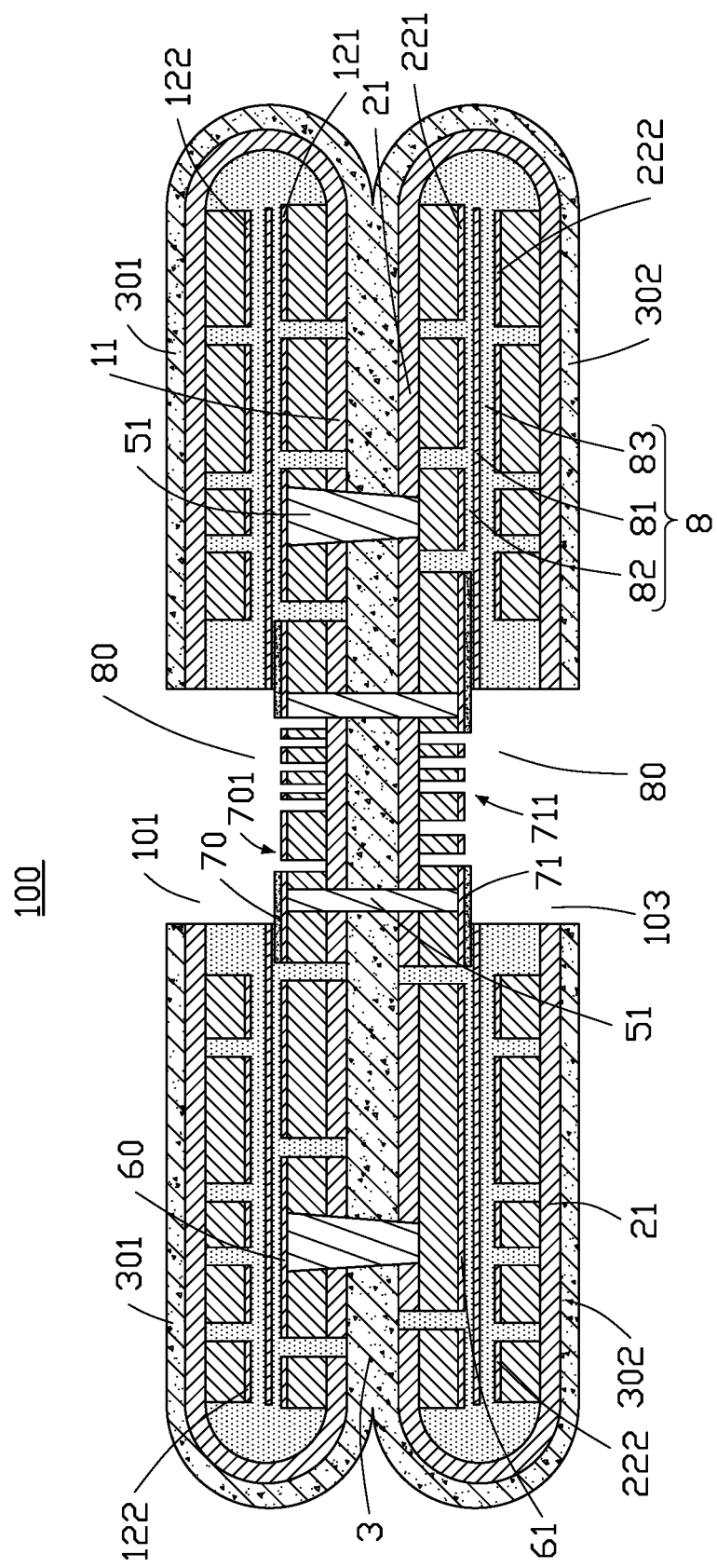
FIG. 7 is a cross-sectional view of the composite circuit board obtained after laminating a second adhesive material.

Referring to FIG. 7, the two first outer conductive circuits 122, the portion of the first adhesive layer 301, and the portion of the first insulating layer 11 corresponding to the separated first adhesive layer 301 are bent back and laminated on the fourth adhesive layer 83 on the surface of the first solder mask 70, such that the first window 101 of a predetermined size is formed by the two ends of the separated first adhesive layer 301 and the first insulating layer 11 facing each other. Similarly, the two second outer conductive circuits 222, the portion of the second adhesive layer 302, and the portion of the second insulating layer 21 corresponding to the separated second adhesive layer 302 are bent back and laminated on the fourth adhesive layer 83 on the surface of the second solder mask 71, such that a second window 103 of a predetermined size is formed by the two ends of the separated second adhesive layer 302 and the second insulating layer 21 facing each other, thereby obtaining a composite circuit board 100.

In one embodiment, the first window 101, the third opening 80 defined in one of the second adhesive materials 8, and the first opening 701 defined in the first solder mask 70 communicate with each other, so that a portion of the first metal protective layer 60 is revealed through the first opening 101, the third opening 80, and the first opening 701.

In one embodiment, the second window 103, the third opening 80 defined in the other one of the second adhesive materials 8, and the second opening 711 defined in the second solder mask 71 communicate with each other, so that a portion of the second solder mask 71 is revealed through the second window 103, the third opening 80, and the second opening 711.

After laminating, the two fourth adhesive layers 83 fill in gaps of the first outer conductive circuit 122 and the second outer conductive circuit 222, and the two third adhesive layers 82 fill in gaps of the first inner conductive circuit 121 and the second inner conductive circuit.

Figure 8:
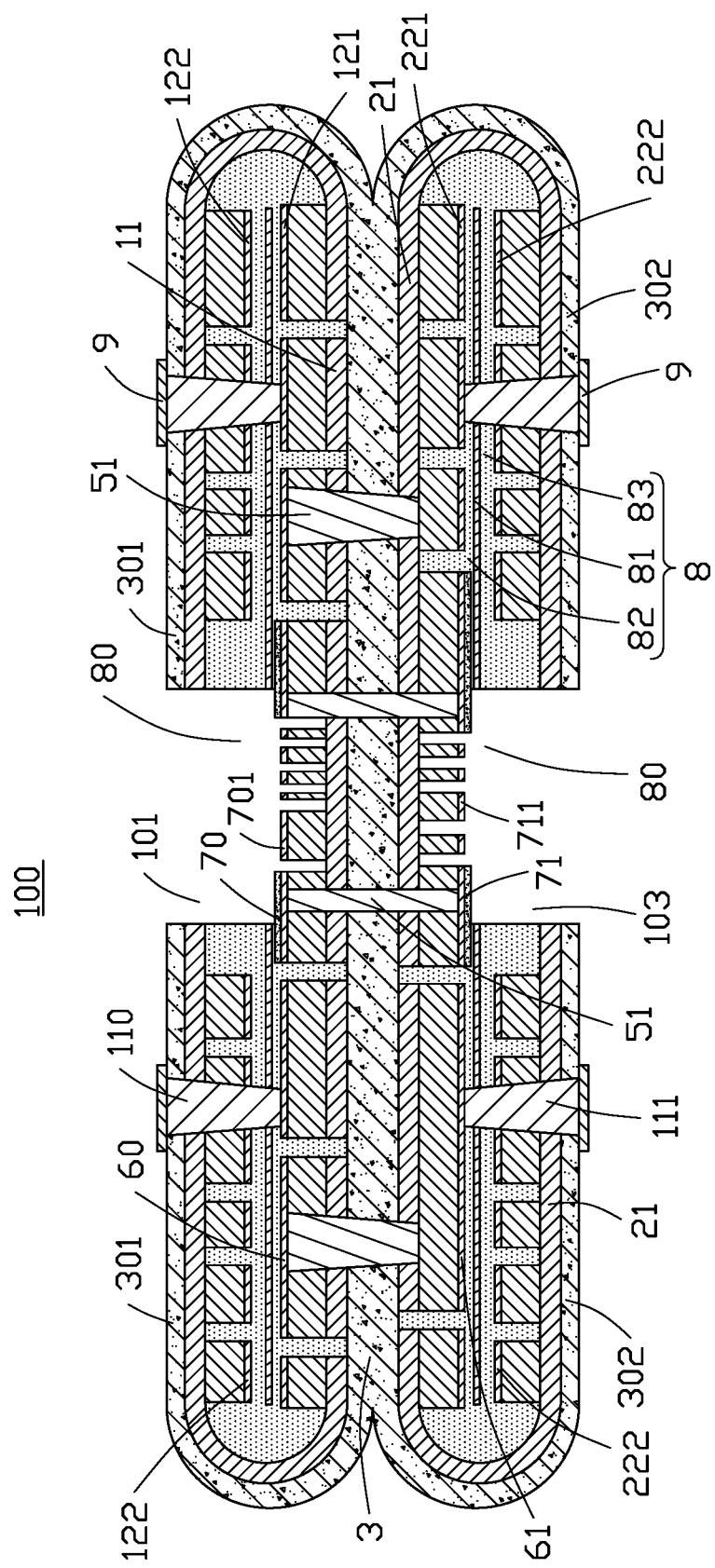
FIG. 8 is a cross-sectional view of forming conductive holes in the composite circuit board.

Referring to FIG. 8, a second conductive hole 110 and a third conductive hole 111 are formed in the composite circuit board 100. The second conductive hole 110 is used for conduction between the first outer conductive circuit 122 and the first inner conductive circuit 121, and the third conductive hole 111 is used for conduction between the second outer conductive circuit 222 and the second inner conductive circuit 221. The second conductive hole 110 and the third conductive hole 111 are formed by first defining blind holes, and then electroplating the blind holes or printing conductive paste in the blind holes. In one embodiment, after forming the second conductive hole 110 and the third conductive hole 111, a solder mask treatment process is performed on surfaces of the second conductive hole 110 and the third conductive hole 111, so that a third solder mask 9 is formed on the surfaces of the second conductive hole 110 and the third conductive hole 111.

The manufacturing method of the composite circuit board 100 has the following advantages.

First, the inner conductive circuit and the outer conductive circuit are manufactured in one piece simultaneously and are not affected by external forces in the subsequent manufacturing process, and have good dimensional stability.

Second, the first adhesive material layer 3 is separated into the first adhesive layer 301 and the second adhesive layer 302, and after the first adhesive layer 301 and the second adhesive layer 302 are bent back, the first adhesive layer 301 (second adhesive layer 302) and the first insulating layer 11 (second insulating layer 21) serve as a protective layer for the first outer conductive circuit 122 (second outer conductive circuit 222), thereby saving use of a cover film.

Third, the first window 101 and the second window 103 are formed by bending back the split two ends of the first adhesive material layer 3, so that there is no need to cut the first window 101 and the second window 103, which omits the risk of damaging inner conductive circuits and simplifies the manufacturing process.

FIGS. 9-15 show a second embodiment of a method of manufacturing a composite circuit board. The second embodiment is substantially similar to the first embodiment and includes the following steps. Some of the steps that are the same as in the first embodiment are not described for the brevity of description.

Figure 9:
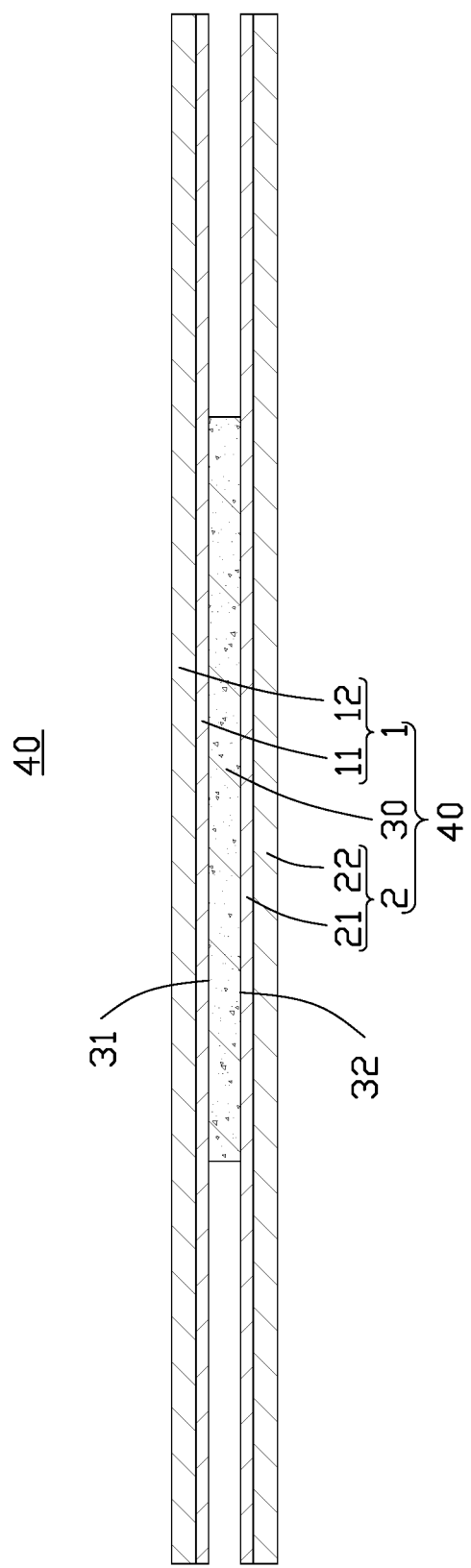
FIG. 9 is a cross-sectional view of a composite substrate according to a second embodiment.

Referring to FIG. 9, a composite substrate unit 40 includes a first insulating layer 11, a second insulating layer 21, a first copper-clad layer 12, a second copper-clad layer 22, and a first adhesive material layer 30. The composite substrate unit 40 is formed as a single piece. In the second embodiment, the first adhesive material layer 30 cannot be split into the first adhesive layer 301 and the second adhesive layer 302. A size of the first adhesive material layer 3 is smaller than a size of the first copper-clad layer 12 and the second copper-clad layer 22. Thus, the first adhesive material layer 3 adheres to only a portion of the first insulating layer 11 and a portion of the second insulating layer 21.

Specifically, the first adhesive material layer 30 only adheres to the first insulating layer 11 and the second insulating layer 21 at a third predetermined position. The third predetermined position is a position for subsequently forming the first inner conductive circuit 121 and the second inner conductive circuit 221. The portion of the first insulating layer 11 and the portion of the second insulating layer 21 outside of the third predetermined position can be bent back in a subsequent step.

That is, each of the composite substrate units 40 includes the first adhesive material layer 30, the first insulating layer 11 and the second insulating layer 21 respectively located on the first surface 31 and the second surface 32 of the first adhesive material layer 30, and the first copper-clad layer 12 and the second copper-clad layer 22 respectively located on a surface of the first insulating layer 11 and a surface of the second insulating layer 21 facing away from the first adhesive material layer 30.

Figure 10:
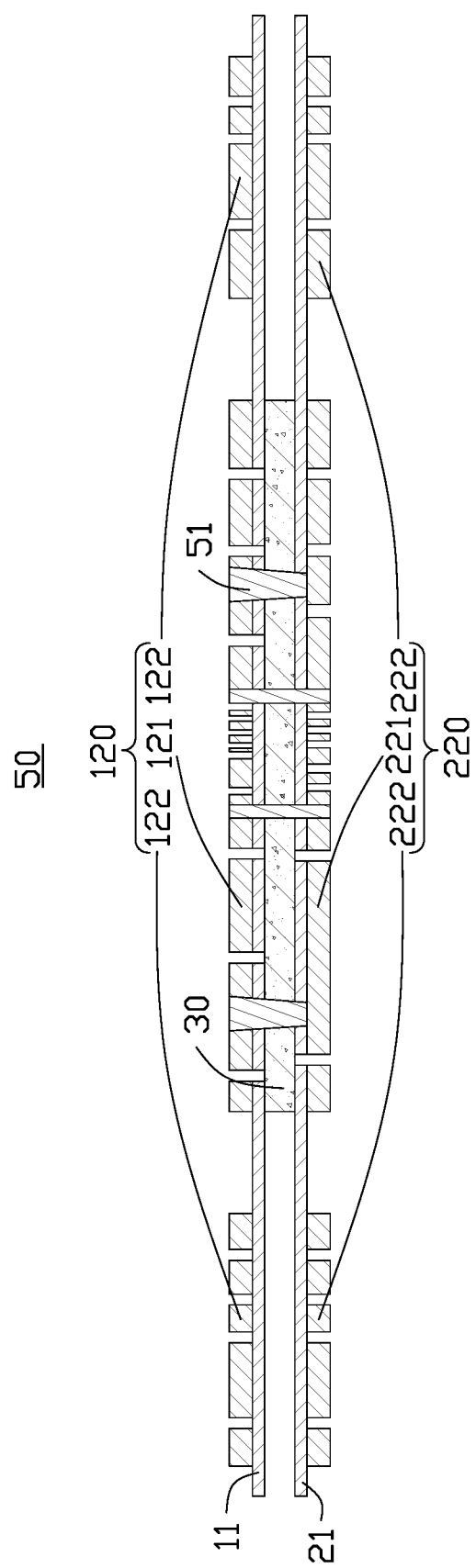
FIG. 10 is a cross-sectional view of forming the composite substrate shown in FIG. 9 into a composite circuit board intermediate structure.

Referring to FIG. 10, the composite substrate unit 40 is etched to form a composite circuit board unit 50.

The composite circuit board unit 50 includes the first adhesive material layer 30, the first insulating layer 11 and the second insulating layer 21 respectively located on the first surface 31 and the second surface 32 of the first adhesive material layer 30, a first circuit layer 120 located on a surface of the first insulating layer 11 facing away from the first adhesive material layer 30, and a second circuit layer 220 located on a surface of the second insulating layer 21 facing away from the first adhesive material layer 30. The position of the first adhesive material layer 30 corresponds to the positions of the first inner conductive circuit 121 and the second inner conductive circuit 221.

Figure 11:
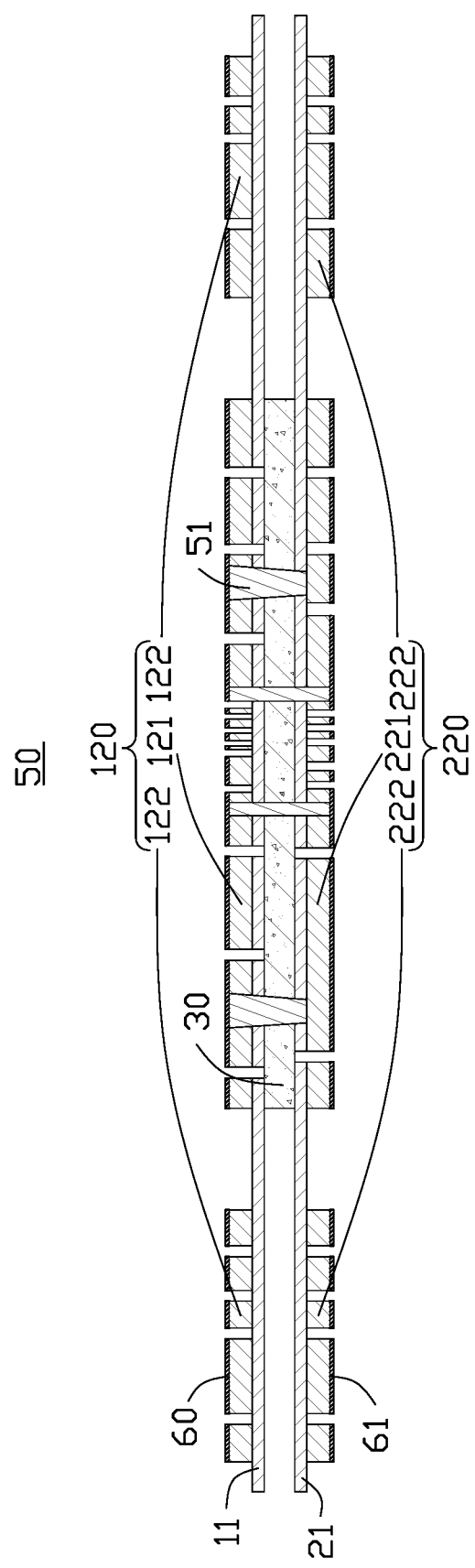
FIG. 11 is a cross-sectional view of forming a first metal protection layer and a second metal protection layer on the basis of FIG. 10.

Referring to FIG. 11, the first metal protection layer 60 and the second metal protection layer 61 are formed on two opposite surfaces of the composite circuit board unit 50, respectively.

Figure 12:
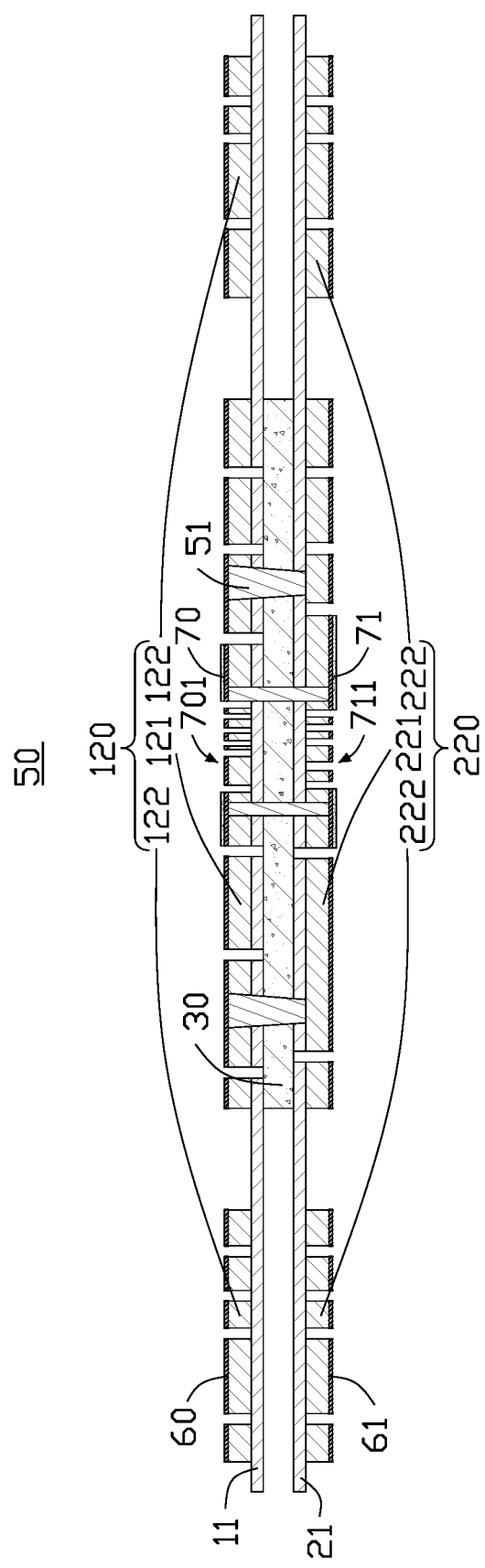
FIG. 12 shows a first solder mask and a second solder mask formed on the surface of the first metal protection layer and the second metal protection layer.

Referring to FIG. 12, the first solder mask 70 is formed on a surface of the first metal protection layer 60, and the second solder mask 71 is formed on a surface of the second metal protection layer 61.

In the second embodiment, since the composite circuit board unit 50 is formed as a single piece, the step of cutting in the first embodiment is omitted.

In the second embodiment, since the first adhesive material layer 30 is provided, a step of splitting the first adhesive material layer 30 is omitted.

Figure 13:
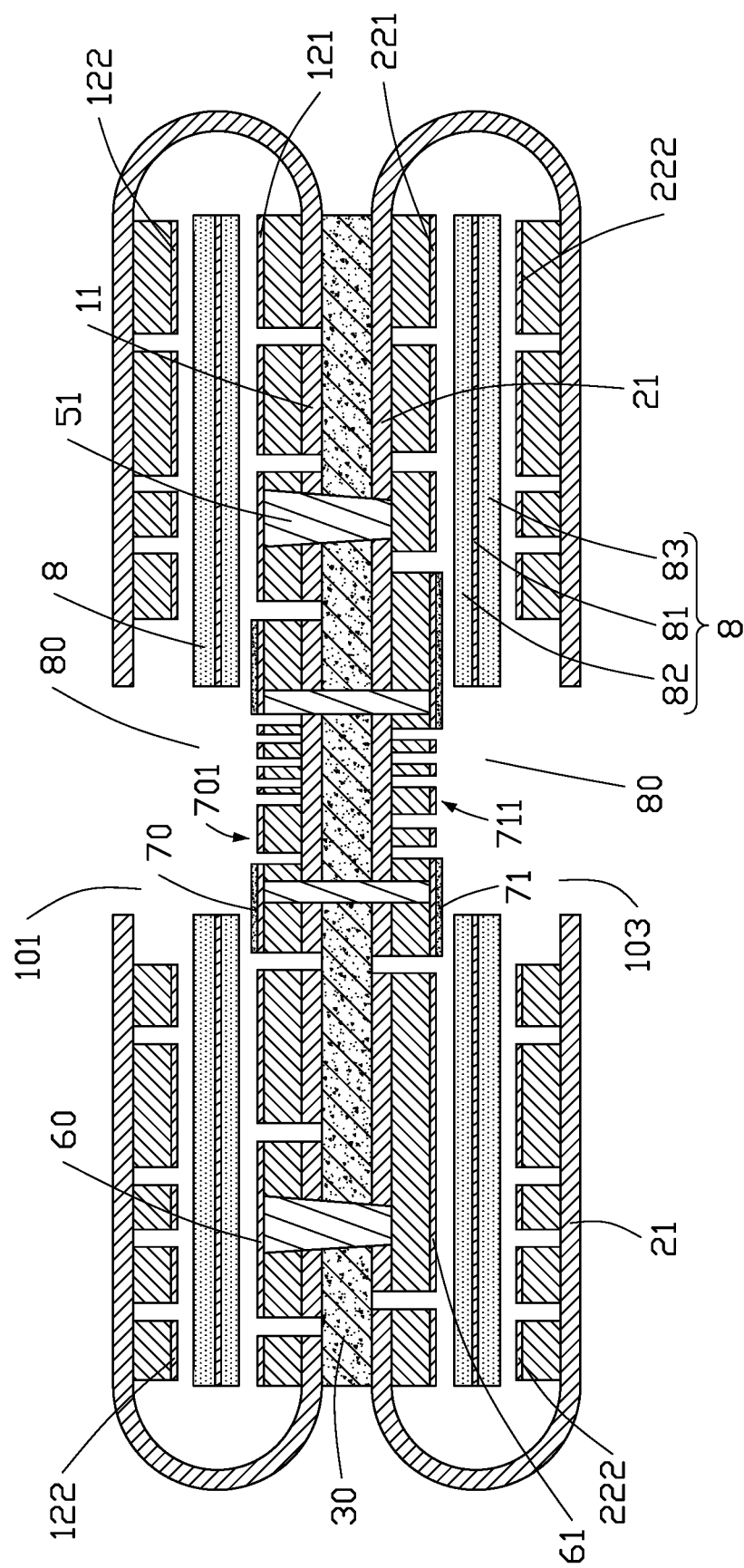
FIG. 13 shows folding a first outer conductive circuit and a second outer conductive circuit and providing a second adhesive material.
Figure 14:
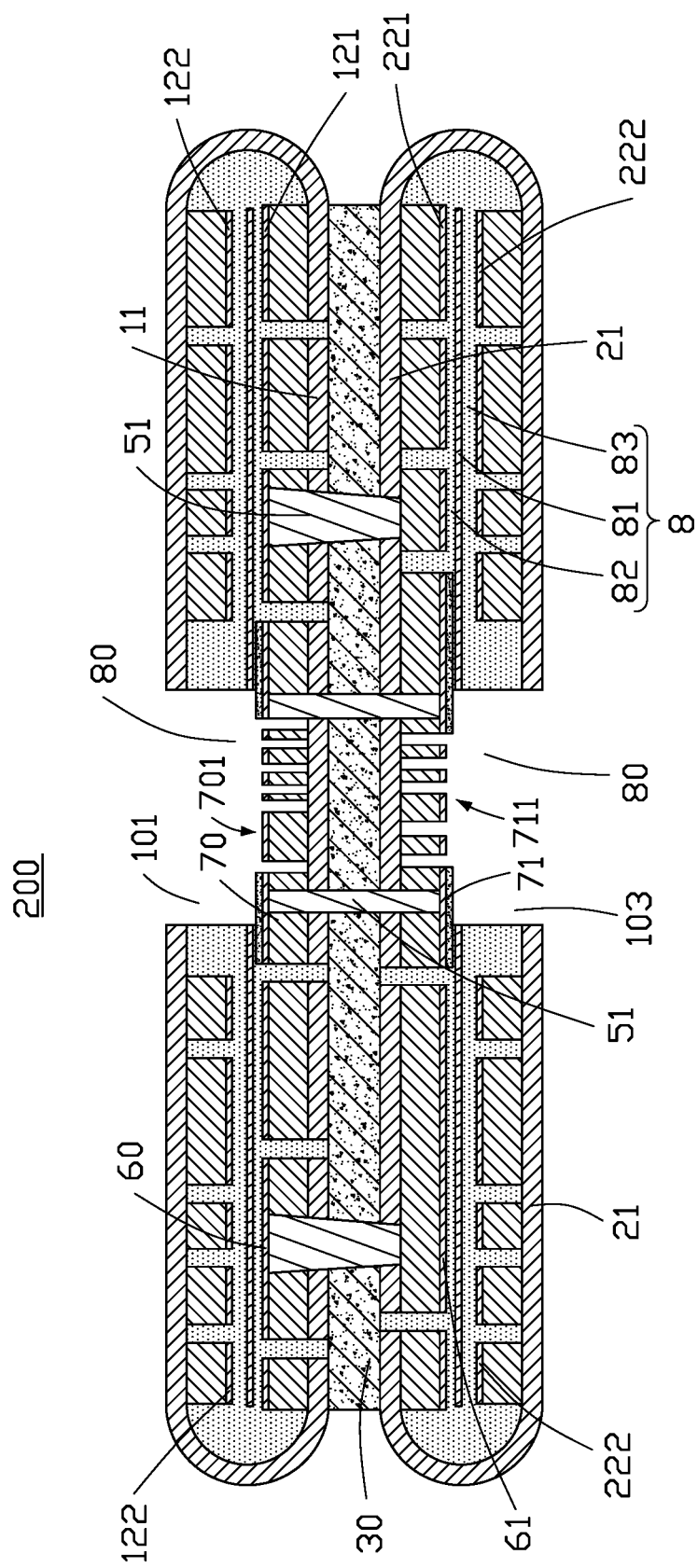
FIG. 14 is a cross-sectional view of the composite circuit board obtained after laminating the second adhesive material.

Referring to FIGS. 13-14, the two second adhesive materials 8 are provided. Because the two ends of the first insulating layer 11 and the two ends of the second insulating layer 21 do not adhere with the first adhesive material layer 30, the two ends of the first insulating layer 11 and the two ends of the second insulating layer 21 are bent back, so that the first outer conductive circuit 122 is laminated on the fourth adhesive layer 83 on the surface of the first solder mask 70, and the second outer conductive circuit 222 is laminated on the fourth adhesive layer 83 on the surface of the second solder mask 71.

FIG. 8 shows an embodiment of a composite circuit board 100 provided by the first embodiment of a method of manufacturing a composite circuit board. The composite circuit board 100 includes a first adhesive material layer 3 including a first surface 31 and a second surface 32, a first insulating layer 11 located on the first surface 31, a second insulating layer 21 located on the second surface 32, a first circuit layer 120 located on a surface of the first insulating layer 11, and a second circuit layer 220 located on a surface of the second insulating layer 21.

The first circuit layer 120 includes a first inner conductive circuit 121 and a first outer conductive circuit 122 located at both ends of the first inner conductive circuit 121. A first metal protection layer 60 is formed on a surface of the first inner conductive circuit 121. A first solder mask 70 is formed on a portion of the first metal protection layer 60, and the first solder mask 70 defines a first opening 701.

The second circuit layer 220 includes a second inner conductive circuit 221 and a second outer conductive circuit 222 located at both ends of the second inner conductive circuit 221. A second metal protection layer 61 is formed on a surface of the second inner conductive circuit 221. A second solder mask 71 is formed on a portion of the second metal protection layer 61, and the second solder mask 71 defines a second opening 711.

The first adhesive material layer 3 is adhered to positions of the first insulating layer 11 and the second insulating layer 21 respectively corresponding to the first inner conductive circuit 121 and the second inner conductive circuit 121. End portions of the first adhesive material layer 3 adhered to portions of the first insulating layer 11 and the second insulating layer 21 respectively located outside the first inner conductive circuit 121 and the second inner conductive circuit 221 are separated into a first adhesive layer 301 and a second adhesive layer 302. The first adhesive layer 301 is formed on the portion of the surface of the first insulating layer 11 corresponding to the first outer conductive circuit 122. The second adhesive layer 302 is formed on the portion of the surface of the second insulating layer 21 corresponding to the second outer conductive circuit 222.

The two first outer conductive circuits 122 at both ends of the first inner conductive circuit 121 are bent back and arranged directly facing the first inner conductive circuit 121 and insulated from each other. A first window 101 of a predetermined size is formed by the two first outer conductive circuits 122. The first window 101 and the first opening 701 communicate with each other to reveal the first metal protection layer 60 revealed by the first solder mask 70. The first metal protection layer 60 revealed by the first window 101 can be used as a COF for setting a driver IC.

The two second outer conductive circuits 222 at both ends of the second inner conductive circuit 221 are bent back and arranged directly facing the second inner conductive circuit 221 and insulated from each other. A second window 103 of a predetermined size is formed by the two second outer conductive circuits 222. The second window 103 and the second opening 711 communicate with each other to reveal the second metal protection layer 61 revealed by the second solder mask 71. The second metal protection layer 61 revealed by the second opening 103 can be used as a COF for setting a driver IC.

A second adhesive material layer 8 is provided between the first inner conductive circuit 121 and the first outer conductive circuit 122, and further provided between the second inner conductive circuit 221 and the second outer conductive circuit 222 for insulation. In one embodiment, each second adhesive material layer 8 includes a third insulating layer 81, a third adhesive layer 82 and a fourth adhesive layer 83 respectively formed on opposite surfaces of the third insulating layer 81. The second adhesive material layer 8 defines a third opening 80. The second adhesive material layer 8 covers a portion of the first solder mask 70 (and the second solder mask 71), and the third opening 80 reveals a portion of the first solder mask 70 (and the second solder mask 71).

The first adhesive material layer 3 is a material that can be split. For example, the first adhesive material layer 3 provided in the first embodiment is a first adhesive layer 301 and a second adhesive layer 302, so that when the first outer conductive circuit 122 is bent back to face the first inner conductive circuit 121, the first adhesive layer 301 and the first insulating layer 11 together serve as a cover layer for the first outer conductive circuit 122. When the second outer conductive circuit 222 is bent back to face the second inner conductive circuit 221, the second adhesive layer 302 and the second insulating layer 21 together serve as a cover layer for the second outer conductive circuit 222.

Figure 15:
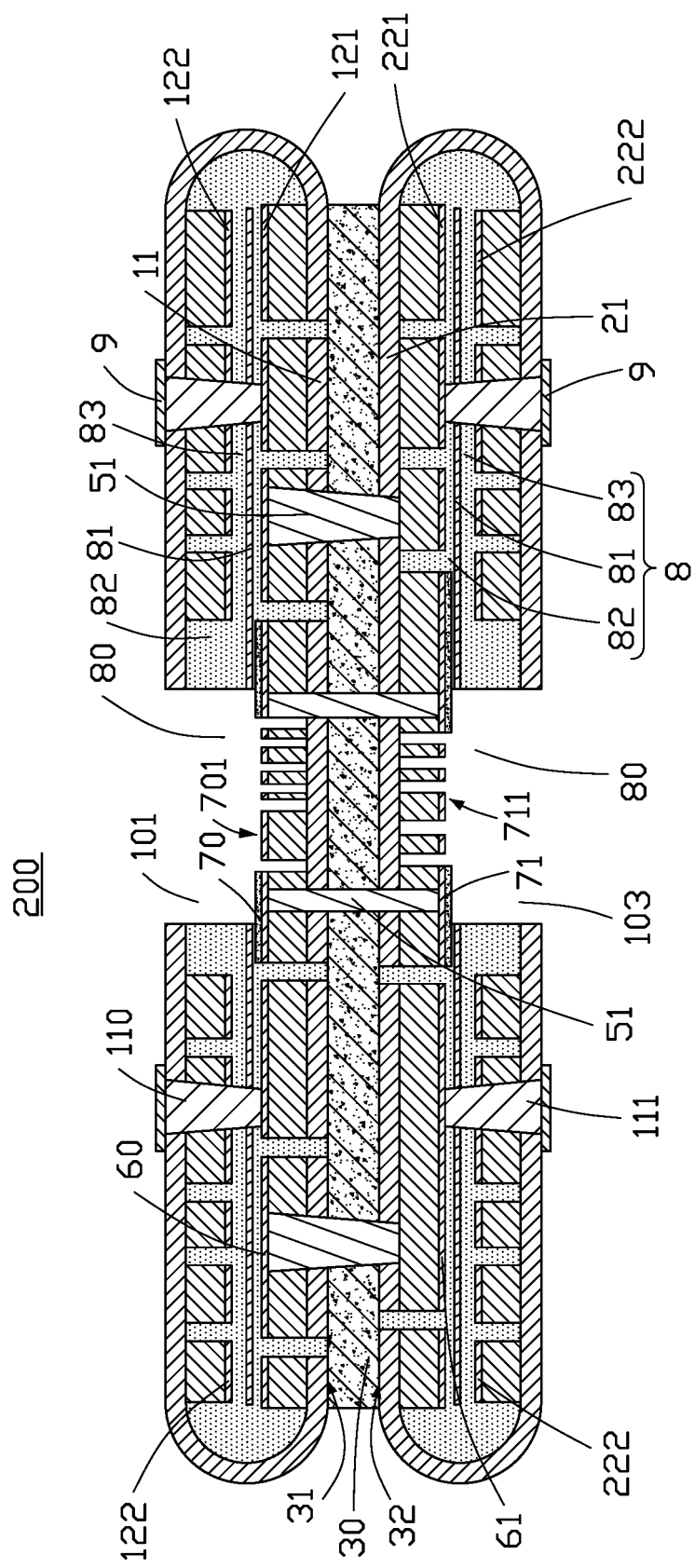
FIG. 15 is a cross-sectional view of forming conductive holes in the composite circuit board.

FIG. 15 shows an embodiment of a composite circuit board 200 provided by the second embodiment of a method of manufacturing a composite circuit board. The difference between the composite circuit board 200 and the composite circuit board 100 is that the first adhesive material layer 3 is replaced by a first adhesive material layer 30. The first adhesive material layer 30 cannot be split and only serves as an adhesive for adhering a portion of the first insulating layer 11 corresponding in position to the first inner conductive circuit 121 and a portion of the second insulating layer 21 corresponding in position to the second inner conductive circuit 221. In this way, when the first outer conductive circuit 122 is bent back to face the first inner conductive circuit 121, the first insulating layer 11 serves as the cover layer for the first outer conductive circuit 122, and when the second outer conductive circuit 222 is bent back to face the second inner conductive circuit 221, the second insulating layer 21 serves as the cover layer for the second outer conductive circuit 222.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of manufacturing a composite circuit board, the method comprising:
   providing a composite circuit board unit comprising a first adhesive material layer, a first circuit layer located on one side of the first adhesive material layer, and a second circuit layer located on another side of the first adhesive material layer, the first circuit layer comprising a first inner conductive circuit and a first outer conductive circuit located at both ends of the first inner conductive circuit, and the second circuit layer comprising a second inner conductive circuit and a second outer conductive circuit located at both ends of the second inner conductive circuit;

forming a first metal protection layer on a surface of the first inner conductive circuit, and forming a second metal protection layer on a surface of the second inner conductive circuit;

forming a first solder mask and a second solder mask respectively on a portion of a surface of the first metal protection layer and a portion of a surface of the second metal protection layer, the first solder mask defining a first opening revealing a portion of the first metal protective layer, the second solder mask defining a second opening revealing a portion of the second metal protective layer;

providing two second adhesive material layers, each of the two second adhesive material layers defining a third opening, a size of the third opening being smaller than a size of the first solder mask layer or the second solder mask layer, the two second adhesive material layers respectively provided on a surface of the first inner conductive circuit and a surface of the second inner conductive circuit;

folding back the first outer conductive circuit at two ends so that the first outer conductive circuit at the two ends faces the first inner conductive circuit and is laminated on the second adhesive material layer, the two ends spaced a predetermined distance apart to form a first window, wherein the first window, the third opening in one of the second adhesive material layers, and the first opening of the first solder mask communicate with each other;

folding back the second outer conductive circuit at two ends so that the second outer conductive circuit at the two ends faces the second inner conductive circuit and is laminated on the second adhesive material layer, the two ends spaced a predetermined distance apart to form a second window, wherein the second window, the third opening in the other one of the second adhesive material layers, and the second opening of the second solder mask communicate with each other.

2. The method of claim 1, wherein:
the composite circuit board unit further comprises a first insulating layer and a second insulating layer provided on opposite surfaces of the first adhesive material layer.

3. The method of claim 1, wherein:
the composite circuit board unit further comprises a first conductive hole conducting the first circuit layer and the second circuit layer; and
the first conductive hole is a conductive blind hole or a conductive through hole.

4. The method of claim 2, wherein the step of providing the composite circuit board unit comprises:
providing a first copper-clad substrate in the form of a coil, a second copper-clad substrate in the form of a coil, and the first adhesive material layer in the form of a coil, wherein the first copper-clad substrate comprises the first insulation layer and a first copper-clad layer formed on a surface of the first insulating layer; the second copper-clad substrate comprises the second insulating layer and a second copper-clad layer formed on a surface of the second insulating layer; and the first insulating layer of the first copper-clad substrate and the second insulating layer of the second copper-clad substrate are respectively formed on opposite surfaces of the first adhesive material layer in a roll-to-roll manner to obtain a composite substrate comprising a plurality of composite substrate units coupled in sequence;

etching the composite substrate to form the first circuit layer from the first copper-clad layer and form the second circuit layer from the second copper-clad layer;

forming the first conductive hole in each composite substrate unit to obtain a composite circuit board intermediate structure; and cutting a boundary of each composite circuit board unit in the composite circuit board intermediate structure to obtain the plurality of composite circuit board units.

5. The method of claim 4, wherein:
the first adhesive material layer is adhered on an entire surface of the first insulating layer and an entire surface of the second insulating layer.

6. The method of claim 5, wherein before the steps of folding back the first outer conductive circuit at two ends so that the first outer conductive circuit at the two ends faces the first inner conductive circuit and is laminated on the second adhesive material layer and folding back the second outer conductive circuit at two ends so that the second outer conductive circuit at the two ends faces the second inner conductive circuit and is laminated on the second adhesive material layer, the method further comprises:
splitting the first adhesive material layer from opposite ends of the first adhesive material layer to a second predetermined position of the first adhesive material layer, thereby separating the first adhesive material layer into a first adhesive layer and a second adhesive layer.

7. The method of claim 4, wherein:
the first adhesive material layer is adhered to a portion of the first insulating layer and a portion of the second insulating layer.

8. The method of claim 7, wherein:
the first adhesive material layer is adhered to the portions of the first insulating layer and the second insulating layer corresponding in position to the first inner conductive circuit and the second inner conductive circuit, respectively.

9. The method of claim 1, wherein:
the second adhesive material layer comprises a third insulating layer, and a third adhesive layer and a fourth adhesive layer respectively provided on opposite surfaces of the third insulating layer;
when the first outer conductive circuit is laminated on one of the second adhesive material layers, the third adhesive layer fills in gaps of the first inner conductive circuit, and the fourth adhesive layer fills in gaps of the first outer conductive circuit;
when the second outer conductive circuit is laminated on the other one of the second adhesive material layers, the third adhesive layer fills in gaps of the second inner conductive circuit, and the fourth adhesive layer fills in gaps of the second outer conductive circuit.

10. The method of claim 1, wherein after the steps of laminating the first outer conductive circuit and the second outer conductive circuit on the second adhesive material layers, the method further comprises:
forming a second conductive hole and a third conductive hole;
the second conductive hole is used for conducting the first inner conductive circuit and the first outer conductive circuit; and the third conductive hole is used for conducting the second inner conductive circuit and the second outer conductive circuit.

\* \* \* \* \*